US012327584B2

(12) United States Patent
Kim et al.

(10) Patent No.: US 12,327,584 B2
(45) Date of Patent: Jun. 10, 2025

(54) BIT LINE SENSE AMPLIFIER OF SEMICONDUCTOR MEMORY DEVICE AND SEMICONDUCTOR MEMORY DEVICE HAVING THE SAME

(71) Applicant: SAMSUNG ELECTRONICS CO., LTD., Suwon-si (KR)

(72) Inventors: Donggeon Kim, Suwon-si (KR); Bok-Yeon Won, Suwon-si (KR); Selyung Yoon, Suwon-si (KR); Jonghyuk Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 174 days.

(21) Appl. No.: 18/340,216

(22) Filed: Jun. 23, 2023

(65) Prior Publication Data

US 2024/0135987 A1 Apr. 25, 2024
US 2024/0233811 A9 Jul. 11, 2024

(51) Int. Cl.
*G11C 11/4091* (2006.01)
*G11C 11/4094* (2006.01)
*G11C 11/4096* (2006.01)

(52) U.S. Cl.
CPC ...... *G11C 11/4091* (2013.01); *G11C 11/4094* (2013.01); *G11C 11/4096* (2013.01)

(58) Field of Classification Search
CPC ............ G11C 11/4091; G11C 11/4094; G11C 11/4096; G11C 11/4097
USPC ....................................................... 365/191
See application file for complete search history.

(56) References Cited

U.S. PATENT DOCUMENTS

| | | | |
|---|---|---|---|
| 5,831,928 A * | 11/1998 | Nakano | G11C 7/10 365/63 |
| 9,356,044 B2 | 5/2016 | Seol et al. | |
| 9,922,695 B2 | 3/2018 | Tomishima et al. | |
| 9,935,037 B2 | 4/2018 | Kang et al. | |
| 10,020,038 B1 * | 7/2018 | Nishizaki | G11C 8/10 |
| 10,453,518 B1 | 10/2019 | Nagai | |
| 10,490,258 B2 | 11/2019 | Onuki et al. | |

(Continued)

FOREIGN PATENT DOCUMENTS

| | | | |
|---|---|---|---|
| DE | 10020554 B4 * | 4/2010 | ........ G11C 11/4087 |
| KR | 10-0773161 | 11/2007 | |
| KR | 10-2022-0005200 | 1/2022 | |

*Primary Examiner* — Fernando Hidalgo
(74) *Attorney, Agent, or Firm* — MORGAN, LEWIS & BOCKIUS LLP

(57) ABSTRACT

A bit line sense amplifier of a semiconductor memory device includes: sense amplifier blocks including a PMOS driver or an NMOS driver that detects and amplifies a signal difference between a bit line and a complimentary bit line, and sequentially arranged in a bit line extending direction; column selection units that connect the bit line and a local input/output line according to a first column selection signal; complimentary column selection units that connect the complimentary bit line and a complimentary local input/output line according to a second column selection signal; column selection lines that transmit the first column selection signal to each of the column selection units; and complimentary column selection lines that transmit the second column selection signal to each of the complimentary column selection units. The column selection units and the complimentary column selection units may be disposed to be distributed between the sense amplifier blocks.

20 Claims, 6 Drawing Sheets

(56) References Cited

U.S. PATENT DOCUMENTS

| | | |
|---|---|---|
| 11,380,702 B2 | 7/2022 | Kim et al. |
| 2009/0147602 A1* | 6/2009 | Kang .................. G11C 11/4091 365/205 |
| 2016/0284390 A1 | 9/2016 | Tomishima et al. |
| 2017/0309325 A1 | 10/2017 | Onuki et al. |
| 2022/0005820 A1 | 1/2022 | Kim et al. |
| 2022/0293619 A1 | 9/2022 | Kim et al. |

* cited by examiner

BIT LINE SENSE AMPLIFIER OF SEMICONDUCTOR MEMORY DEVICE AND SEMICONDUCTOR MEMORY DEVICE HAVING THE SAME

CROSS-REFERENCE TO RELATED APPLICATION

This application claims priority under 35 U.S.C. § 119 to and the benefit of Korean Patent Application No. 10-2022-0138737, filed on Oct. 25, 2022, in the Korean Intellectual Property Office, the contents of which are incorporated by reference herein in their entirety.

TECHNICAL FIELD

The present disclosure relates to a bit line sense amplifier of a semiconductor memory device and a semiconductor memory device including the same, and more particularly, to a bit line sense amplifier of a semiconductor memory device in which a sense amplifier block is aligned in a bit line direction, and a semiconductor memory device including the same.

DISCUSSION OF RELATED ART

A bit line sense amplifier of a semiconductor memory device such as dynamic random access memory (DRAM) is a circuit element that detects and amplifies a small signal difference that has occurred to a bit line by a charge sharing between a memory cell and the bit line after the memory cell is accessed, and is an important circuit element for the operation of the semiconductor memory device. The bit line sense amplifier may be part of a read circuitry that is used when data is read from the memory cell. For example, the bit line sense amplifier may perform read, write, and erase operations to a plurality of memory cells.

In general, a structure of the bit line of the semiconductor memory device includes an open bit line structure or a folded bit line structure. The semiconductor memory device with the open bit line structure includes a bit line and a complimentary bit line (or an inverted bit line) extending in opposite directions from the bit line sense amplifier, and the semiconductor memory device with the folded bit line structure includes a bit line and a complimentary bit line extending in the same direction from the bit line sense amplifier. The bit line and the complimentary bit line constitute a bit line pair. The open bit line structure may have a feature size smaller than that of the folded bit line structure, while the folded bit line structure may provide better reduction in the bit line coupling noise in comparison to the open bit line structure.

The bit line sense amplifier may be disposed around the memory cell area, and may be arranged with a structure in which a plurality of sense amplifier blocks is arranged in the direction in which the bit line or the complimentary bit line extends (hereinafter referred to as a multi-stack BLSA structure). In particular, the multi-stack BLSA structure may be more suitable in a cell-on-peri (COP) structure in which the memory cell is formed to overlap a peripheral driving circuit such as the bit line sense amplifier in a vertical direction, and is disposed at a layer different from that of the peripheral driving circuit.

SUMMARY

Embodiments of the present disclosure provide a semiconductor device with an internal arrangement of the bit line sense amplifier being simplified and enhanced.

Embodiments of the present disclosure provide a semiconductor device with an internal wire length of the bit line sense amplifier being reduced.

A bit line sense amplifier of a semiconductor memory device according to an embodiment of the present disclosure includes a plurality of sense amplifier blocks including a PMOS driver and/or an NMOS driver that detects and amplifies a signal difference between a bit line and a complimentary bit line, and sequentially arranged in a first direction in which the bit line and the complimentary bit line extend; a plurality of column selection units that connect the bit line and a local input/output line according to a first column selection signal; a plurality of complimentary column selection units that connect the complimentary bit line and a complimentary local input/output line according to a second column selection signal; a plurality of column selection lines that transmit the first column selection signal to each of the plurality of column selection units and extend in a second direction intersecting the first direction; and a plurality of complimentary column selection lines that transmit the second column selection signal to each of the plurality of complimentary column selection units and extend in the second direction, in which the plurality of column selection units and the plurality of complimentary column selection units are disposed to be distributed between the plurality of sense amplifier blocks sequentially arranged in the first direction.

Each of the plurality of sense amplifier blocks may be disposed between one of the plurality of column selection units and one of the plurality of complimentary column selection units.

The bit line and the complimentary bit line that may be connected to one of the plurality of sense amplifier blocks may be respectively connected to one of the plurality of column selection units and one of the plurality of complimentary column selection units disposed on both sides of the one of the plurality of sense amplifier blocks connected thereto.

At least a part of the plurality of column selection lines may overlap the plurality of column selection units, and at least a part of the plurality of complimentary column selection lines may overlap the plurality of complimentary column selection units.

The plurality of sense amplifier blocks may include first to fourth sense amplifier blocks sequentially arranged, the plurality of column selection units may include first to fourth column selection units, and the plurality of complimentary column selection units may include first to fourth complimentary column selection units.

The first complimentary column selection unit and the second column selection unit may be disposed between the first sense amplifier block and the second sense amplifier block, the second complimentary column selection unit and the third column selection unit may be disposed between the second sense amplifier block and the third sense amplifier block, and the third complimentary column selection unit and the fourth column selection unit may be disposed between the third sense amplifier block and the fourth sense amplifier block.

The first column selection unit may be on a side of the first sense amplifier block opposite to the first complimentary column selection unit, and the fourth complimentary column selection unit may be disposed on a side of the fourth sense amplifier block opposite to the fourth column selection unit.

The first complimentary column selection unit may be disposed between the first sense amplifier block and the second sense amplifier block, the second complimentary column selection unit and the third column selection unit may be disposed between the second sense amplifier block and the third sense amplifier block, and the fourth column selection unit may be disposed between the third sense amplifier block and the fourth sense amplifier block.

The first and second column selection units may be disposed on a side of the first sense amplifier block opposite to the first complimentary column selection unit, and the third and fourth complimentary column selection units may be disposed on a side of the fourth sense amplifier block opposite to the fourth column selection unit.

The second column selection unit may be disposed between the first column selection unit and the first sense amplifier block, and the third complimentary column selection unit may be disposed between the fourth complimentary column selection unit and the fourth sense amplifier block.

The plurality of column selection units and the plurality of complimentary column selection units may be NMOS transistors.

A semiconductor memory device according to an embodiment includes a memory cell array in which a plurality of memory cells are arranged; and a bit line sense amplifier that performs read, write, and erase operations to the plurality of memory cells, in which the bit line sense amplifier includes a plurality of sense amplifier blocks including a PMOS driver and/or an NMOS driver that detects and amplifies a signal difference between a bit line and a complimentary bit line, and sequentially arranged in a first direction in which the bit line and the complimentary bit line extend; a plurality of column selection units that connect the bit line and a local input/output line according to a first column selection signal; a plurality of complimentary column selection units that connect the complimentary bit line and a complimentary local input/output line according to a second column selection signal; a plurality of column selection lines that transmit the first column selection signal to each of the plurality of column selection units and extend in a second direction intersecting the first direction; and a plurality of complimentary column selection lines that transmit the second column selection signal to each of the plurality of complimentary column selection units and extend in the second direction, and the plurality of column selection units and the plurality of complimentary column selection units are disposed to be distributed between the plurality of sense amplifier blocks sequentially arranged in the first direction.

The memory cell array may be disposed to overlap the bit line sense amplifier disposing the memory cell array on a layer different from that of the bit line sense amplifier.

The memory cell array may be disposed on either side of the bit line sense amplifier.

The memory cell array and the bit line sense amplifier may be connected in an open bit line structure.

The memory cell array and the bit line sense amplifier may be connected in a folded bit line structure.

The plurality of sense amplifier blocks may include first to fourth sense amplifier blocks sequentially arranged, the plurality of column selection units may include first to fourth column selection units, and the plurality of complimentary column selection units may include first to fourth complimentary column selection units, and the first complimentary column selection unit and the second column selection unit may be disposed between the first sense amplifier block and the second sense amplifier block, the second complimentary column selection unit and the third column selection unit may be disposed between the second sense amplifier block and the third sense amplifier block, and the third complimentary column selection unit and the fourth column selection unit may be disposed between the third sense amplifier block and the fourth sense amplifier block.

The first column selection unit may be disposed on a side of the first sense amplifier block opposite to the first complimentary column selection unit, and the fourth complimentary column selection unit may be disposed on a side of the fourth sense amplifier block opposite to the fourth column selection unit.

The plurality of sense amplifier blocks may include first to fourth sense amplifier blocks sequentially arranged, the plurality of column selection units may include first to fourth column selection units, and the plurality of complimentary column selection units may include first to fourth complimentary column selection units, and the first complimentary column selection unit may be disposed between the first sense amplifier block and the second sense amplifier block, the second complimentary column selection unit and the third column selection unit may be disposed between the second sense amplifier block and the third sense amplifier block, and the fourth column selection unit maybe disposed between the third sense amplifier block and the fourth sense amplifier block.

The first and second column selection units may be disposed on a side of the first sense amplifier block opposite to the first complimentary column selection unit, and the third and fourth complimentary column selection units may be disposed on a side of the fourth sense amplifier block opposite to the fourth column selection unit.

The bit line sense amplifier of the semiconductor memory device according to an embodiment of the present disclosure may simplify the arrangement structure by disposing the column selection unit between the sense amplifier blocks.

In addition, the bit line sense amplifier of the semiconductor memory device according to an embodiment of the present disclosure may reduce the internal wire length of the bit line sense amplifier by disposing the column selection unit between the sense amplifier blocks.

The bit line sense amplifier of the semiconductor memory device according to an embodiment of the present disclosure may reduce the number of wires per unit area that need to be disposed inside the bit line sense amplifier by disposing the column selection unit between the sense amplifier blocks.

BRIEF DESCRIPTION OF THE DRAWINGS

The above and other aspects and features of the present disclosure will become more apparent by describing in detail embodiments thereof with reference to the accompanying drawings, in which.

Figure 1:
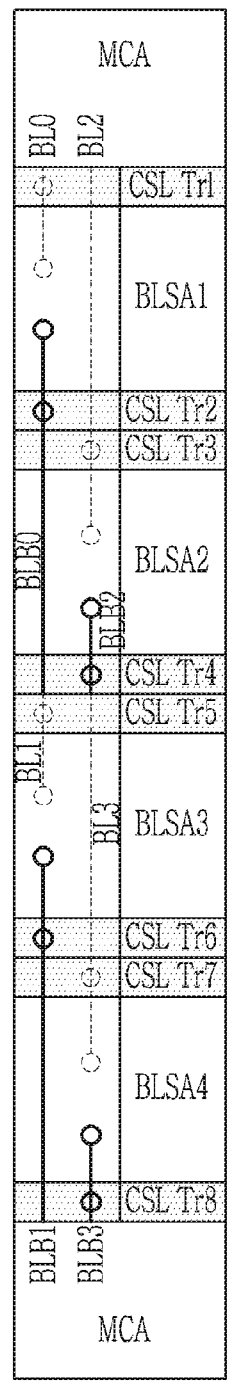
FIG. 1 is a layout view of a bit line sense amplifier of a semiconductor memory device according to an embodiment of the present disclosure.

Since the drawings in FIGS. 1-6 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Embodiments of the present disclosure will be described more fully hereinafter with reference to the accompanying drawings. As those skilled in the art would realize, the described embodiments may be modified in various different ways, all without departing from the spirit or scope of the present disclosure.

The drawings and descriptions are to be regarded as illustrative in nature and not restrictive. Throughout the specification, the same reference numerals or characters refer to the same constituent elements.

The singular form used in this specification is intended to include the plural form as well, unless the context clearly indicates otherwise.

In the specification and claims, the term "and/or" is intended to include any combination of the terms "and" and "or" for its meaning and interpretation. For example, "A and/or B" may be understood to mean "A, B, or A and B".

The phrase "at least one of" in the specification and claims is intended to include the meaning of "at least one selected from the group of" for its meaning and interpretation. For example, "at least one of A and B" may be understood to mean "A, B, or A and B".

Terms such as "first", "second", etc. may be used in this specification to describe various constituent elements, but these constituent elements are not limited by these terms. These terms are only used to distinguish one element from another. For example, the first constituent element may be named as the second constituent element without departing from the right scope of the embodiment, and similarly, the second constituent element may also be named as the first constituent element.

When an element, such as a layer, film, region or substrate, is referred to as being "on" another element, it may be directly on the other element, or an intermediate element may also be present therebetween. In contrast, when an element is referred to as being "directly on" another element, there is no intermediate element. In addition, throughout the specification, the term 'above' of the target element should be understood as positioning above or below the target element, and does not necessarily mean positioning 'above' with reference to the opposite direction of gravity.

Spatially relative terms "below" and "above" may be used to easily describe the relationship between one element or constituent elements and other constituent elements as shown in the drawing. Spatially relative terms are intended to include other directions in the device being used or operated in addition to the directions shown in the drawings. For example, when the device shown in the drawing is turned over, a device positioned 'below' another device may be positioned 'above' another device. Accordingly, the exemplary term "below" may include both lower and upper positions. A device may also be oriented in different directions, so spatially relative terms may be interpreted differently depending on the direction.

When an element (or a region, a layer, a part, etc.) is referred to as "connected" or "coupled" to another element in the specification, it is directly disposed, connected or coupled to the other element mentioned above, or an intervening element may be disposed therebetween.

The terms "connected to" or "coupled to" may include a physical or electrical connection or coupling.

Unless otherwise defined, all terms (including technical and scientific terms) used in this specification have the same meaning as commonly understood by a person of an ordinary skill in the technical field to which the present disclosure belongs. It will be further understood that terms, such as those defined in commonly used dictionaries, should be interpreted as having a meaning that is consistent with their meaning in the context of the specification and claims and should not be interpreted in an idealized or overly formal sense unless expressly so defined herein.

FIG. 1 is a layout view of a bit line sense amplifier of a semiconductor memory device according to an embodiment of the present disclosure.

Referring to FIG. 1, a bit line sense amplifier of a semiconductor memory device according to an embodiment of the present disclosure may include a plurality of sense amplifier blocks BLSA1, BLSA2, BLSA3 and BLSA4, a plurality of column selection units or column selection transistors CSL Tr1, CSL Tr2, CSL Tr3, CSL Tr4, CSL Tr5, CSL Tr6, CSL Tr7, and CSL Tr8, a plurality of bit lines BL0, BL1, BL2 and BL3, and a plurality of complimentary bit lines BLB0, BLB1, BLB2 and BLB3. A memory cell area MCA may be disposed on both sides of the bit line sense amplifier including these elements. The memory cell area MCA refers to an area in which the memory cells are formed, and as shown in FIG. 1, may be disposed on both sides of the bit line sense amplifier, but the present disclosure is not limited thereto. For example, the memory cell area MCA may be disposed on only one side of the bit line sense amplifier, or may be disposed to overlap the bit line sense amplifier by disposing the memory cell area MCA on a layer different from that of the bit line sense amplifier (a cell-on-peri structure). For example, the memory cell area MCA may overlap the bit line sense amplifier in a vertical direction.

FIG. 1 shows the bit line sense amplifiers of two columns in which the plurality of sense amplifier blocks BLSA1, BLSA2, BLSA3, and BLSA4, and the plurality of column selection units or column selection transistors CSL Tr1, CSL Tr2, CSL Tr3, CSL Tr4, CSL Tr5, CSL Tr6, CSL Tr7, and CSL Tr8 are disposed in one column, but the present disclosure is not limited thereto. For example, the bit line sense amplifiers of three or more columns may be disposed.

The plurality of sense amplifier blocks BLSA1, BLSA2, BLSA3, and BLSA4 may be arranged in a direction that the plurality of bit lines BL0, BL1, BL2, and BL3 or the plurality of complimentary bit lines BLB0, BLB1, BLB2, and BLB3 extend, and the plurality of column selection transistors CSL Tr1, CSL Tr2, CSL Tr3, CSL Tr4, CSL Tr5, CSL Tr6, CSL Tr7, and CSL Tr8 may be distributed between the plurality of sense amplifier blocks BLSA1, BLSA2, BLSA3, and BLSA4. With this configuration, internal wire arrangement may be simplified and shortened. In the embodiment of FIG. 1, the first column selection transistor CSL Tr1 is disposed between the upper memory cell area MCA and the first sense amplifier block BLSA1, the second and third column selection transistors CSL Tr2 and CSL Tr3 are disposed between the first sense amplifier block BLSA1 and the second sense amplifier block BLSA2, the fourth and fifth column selection transistors CSL Tr4 and CSL Tr5 are disposed between the second sense amplifier block BLSA2 and the third sense amplifier block BLSA3, the sixth and seventh column selection transistors CSL Tr6 and CSL Tr7 are disposed between the third sense amplifier block BLSA3 and the fourth sense amplifier block BLSA4, and the eighth column selection transistor CSL Tr8 is disposed between the fourth sense amplifier block BLSA4 and the lower memory cell area MCA, however the present disclosure is not limited thereto. For example, the arrangement of the plurality of sense amplifier blocks BLSA1, BLSA2, BLSA3, and BLSA4 and the plurality of column selection transistors CSL Tr1, CSL Tr2, CSL Tr3, CSL Tr4, CSL Tr5, CSL Tr6, CSL Tr7, and CSL Tr8 may be variously modified. In the case of the cell-on-peri structure, the first column selection transistor CSL Tr1 and the eighth column selection transistor CSL Tr8 may be disposed at both ends of the bit line sense amplifier column, and the memory cell area MCA may overlap the bit line sense amplifier column on different layers. In this case, the bit line sense amplifier may function as a peripheral driving circuit, and the memory cells may be disposed over the bit line sense amplifier.

In the embodiment of FIG. 1, four sense amplifier blocks BLSA1, BLSA2, BLSA3, and BLSA4 are described to be disposed to one bit line sense amplifier column, but the present disclosure is not limited thereto. For example, the number of the sense amplifier blocks disposed to one bit line sense amplifier column may be three or less, or five or more. The number of the column selection transistors included in one bit line sense amplifier column may be doubled according to the number of the sense amplifier blocks disposed to one bit line sense amplifier column.

Each of the plurality of bit lines BL0, BL1, BL2, and BL3 may be connected to one sense amplifier block and one column selection transistor, and each of the plurality of complimentary bit lines BLB0, BLB1, BLB2, and BLB3 may also be connected to one sense amplifier block and one column selection transistor. The bit line and the complimentary bit line connected to one sense amplifier block may be respectively connected to the column selection transistors disposed on both sides of the corresponding sense amplifier block. For example, the bit line BL0 and the complimentary bit line BLB0 that are connected to the first sense amplifier block BLSA1 may be respectively connected to the first column selection transistor CSL Tr1 and the second column selection transistor CSL Tr2 which are disposed on both sides of the first sense amplifier block BLSA1, and the bit line BL2 and the complimentary bit line BLB2 that are connected to the second sense amplifier block BLSA2 may be respectively connected to the third column selection transistor CSL Tr3 and the fourth column selection transistor CSL Tr4 which are disposed on both sides of the second sense amplifier block BLSA2. Also, the bit line BL1 and the complimentary bit line BLB1 that are connected to the third sense amplifier block BLSA3 may be respectively connected to the fifth column selection transistor CSL Tr5 and the sixth column selection transistor CSL Tr6 which are disposed on both sides of the third sense amplifier block BLSA3, and the bit line BL3 and the complimentary bit line BLB3 that are connected to the fourth sense amplifier block BLSA4 may be respectively connected to the seventh column selection transistor CSL Tr7 and the eighth column selection transistor CSL Tr8 which are disposed on both sides of the fourth sense amplifier block BLSA4. The column selection transistors CSL Tr2, CSL Tr4, CSL Tr6, and CSL Tr8 connected to the complimentary bit lines BLB0, BLB1, BLB2, and BLB3 may be referred to as complimentary column selection transistors to distinguish from the column selection transistors CSL Tr1, CSL Tr3, CSL Tr5, and CSL Tr7 connected to the bit lines BL0, BL1, BL2, and BL3.

The plurality of column selection transistors CSL Tr1, CSL Tr2, CSL Tr3, CSL Tr4, CSL Tr5, CSL Tr6, CSL Tr7, and CSL Tr8 may be connected to a plurality of column selection lines (see CSL1 of FIG. 3) and a plurality of complimentary column selection lines (see CSL2 of FIG. 3), the plurality of column selection lines may be disposed on a position where at least a part thereof overlaps the corresponding column selection transistors, and the plurality of complimentary column selection lines may be disposed on a position where at least a part thereof overlaps the corresponding complimentary column selection transistors. Also, the plurality of column selection lines may be also disposed on the boundary region between the plurality of sense amplifier blocks BLSA1, BLSA2, BLSA3, and BLSA4 like the plurality of column selection transistors CSL Tr1, CSL Tr2, CSL Tr3, CSL Tr4, CSL Tr5, CSL Tr6, CSL Tr7, and CSL Tr8. The plurality of column selection transistors CSL Tr1, CSL Tr2, CSL Tr3, CSL Tr4, CSL Tr5, CSL Tr6, CSL Tr7, and CSL Tr8 are elements of connecting or disconnecting a local input/output line LIO connected to the bit line BL and the data input/output pin, or connecting or disconnecting a complimentary local input/output line LIOB connected to the complimentary bit line BLB and the data input/output pin in response to signals transmitted through a plurality of column selection lines, thereby functioning as a column selection unit or a complimentary column selection unit, respectively. For example, the first column selection transistor CSL Tr1 may be an element of connecting or disconnecting a local input/output line LIO connected to the bit line BL and the data input/output pin, while the second column selection transistor CSL Tr2 may be an element of connecting or disconnecting a complimentary local input/output line LIOB connected to the complimentary bit line BLB and the data input/output pin in response to signals transmitted through a plurality of column selection lines.

Hereinafter, the column selection transistor may be referred to as a column selection unit, and the complimentary column selection transistor may be referred to as a complimentary column selection unit. However, the column selection unit and the complimentary column selection unit may include an additional constituent element other than the transistor. A column selection line that transmits a column selection signal to the complimentary column selection unit may be distinguished and referred to as a complimentary column selection line. In other words, a plurality of column selection units may connect (or disconnect) the bit line BL and the local input/output line LIO according to a first column selection signal, and a plurality of complimentary column selection units may connect (or disconnect) the complimentary bit line BLB and the complimentary local input/output line LIBO according to a second column selection signal. Also, the plurality of column selection lines (see CSL1 of FIG. 3) that transmit the first column selection signal to each of a plurality of column selection units may extend in a direction intersecting the direction in which the bit line BL extends, and the plurality of complimentary column selection lines (see CSL2 of FIG. 3) that transmit the second column selection signal to each of a plurality of complimentary column selection units may extend in a direction intersecting the direction in which the complimentary bit line BLB extends.

In FIG. 1, first to fourth column selection units may be defined to respectively include the column selection transistors CSL Tr1, CSL Tr3, CSL Tr5, and CSL Tr7, and first to fourth complimentary column selection units may be defined to respectively include the column selection transistors CSL Tr2, CSL Tr4, CSL Tr6, and CSL Tr8. The first complimentary column selection unit (including CSL Tr2) and the second column selection unit (including CSL Tr3) may be disposed between the first sense amplifier block BLSA1 and the second sense amplifier block BLSA2, the second complimentary column selection unit (including CSL Tr4) and the third column selection unit (including CSL Tr5) may be disposed between the second sense amplifier block BLSA2 and the third sense amplifier block BLSA3, and the third complimentary column selection unit (Including CSL Tr6) and the fourth column selection unit (including CSL Tr7) may be disposed between the third sense amplifier block BLSA3 and the fourth sense amplifier block BLSA4. The first column selection unit (including CSL Tr1) may be disposed on a side of the first sense amplifier block BLSA1 opposite to the first complimentary column selection unit (including CSL Tr2), and the fourth complimentary column selection unit (including CSL Tr8) may be disposed on a side of the fourth sense amplifier block BLSA 4 opposite to the fourth column selection unit (including CSL Tr7).

Figure 2:
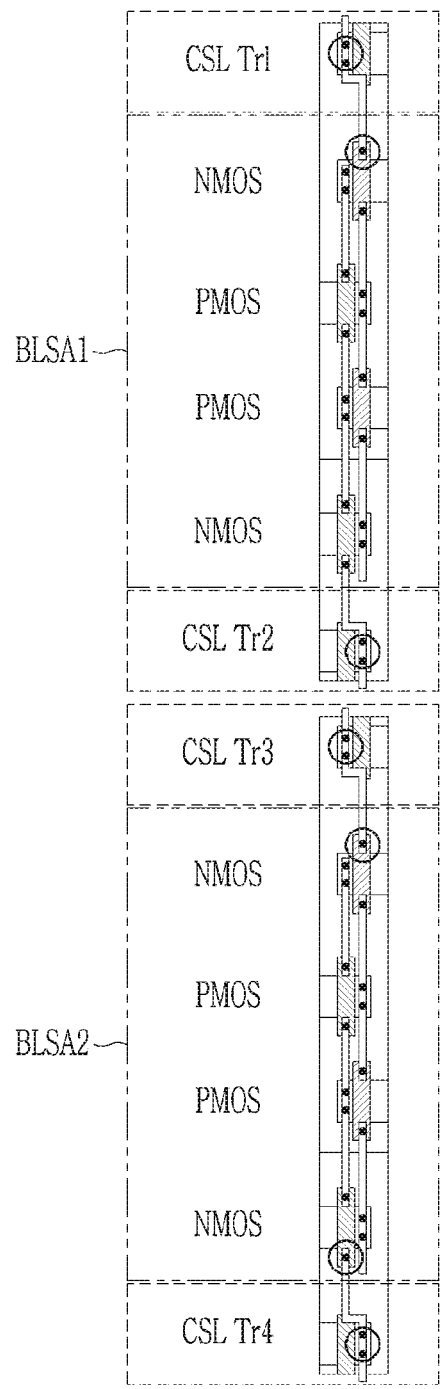
FIG. 2 is a more detailed layout view of a part of a bit line sense amplifier in FIG. 1.
Figure 3:
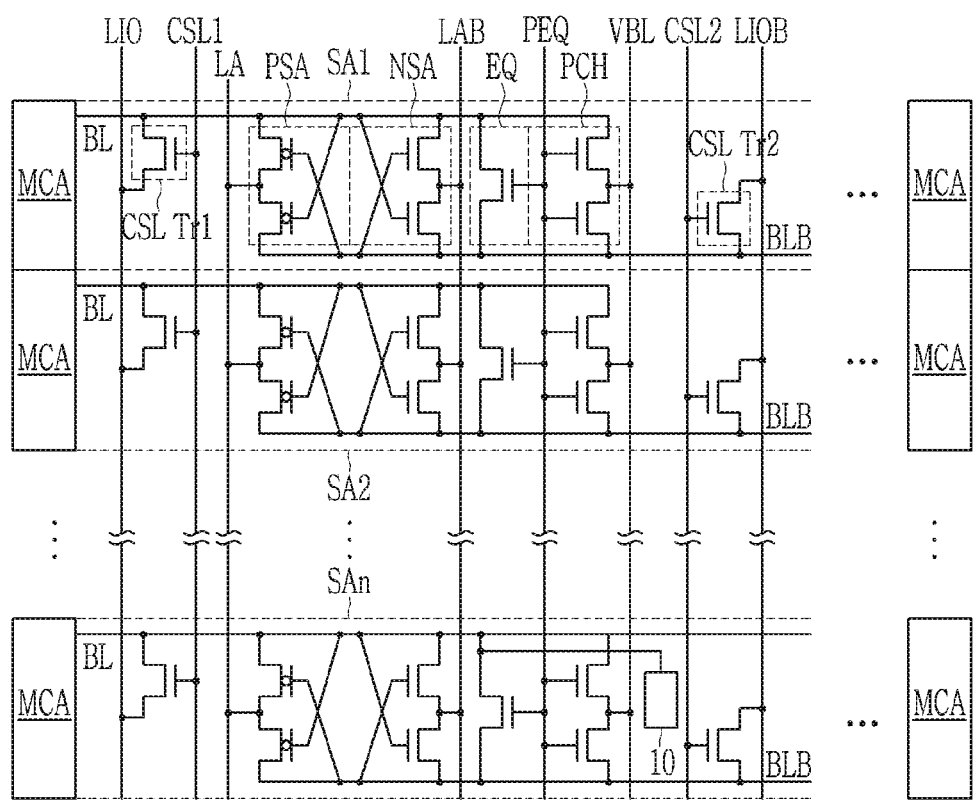
FIG. 3 is a circuit diagram of a bit line sense amplifier of FIG. 1.

FIG. 2 is a more detailed layout view of a part of a bit line sense amplifier in FIG. 1, and FIG. 3 is a circuit diagram of a bit line sense amplifier of FIG. 1.

FIG. 2 shows the area corresponding to the first and second sense amplifier blocks BLSA1 and BLSA2 of FIG. 1 and the first to fourth column selection transistors CSL Tr1, CSL Tr2, CSL Tr3, and CSL Tr4.

Each of the first and second sense amplifier blocks BLSA1 and BLSA2 may include a pair of n-channel metal-oxide semiconductor (NMOS) transistor NMOS and a pair of p-channel metal-oxide semiconductor (PMOS) transistor PMOS. A pair of NMOS transistors NMOS may compose one NMOS driver NSA, and a pair of PMOS transistor PMOS may compose one PMOS driver PSA. In addition, each of the first and second sense amplifier blocks BLSA1 and BLSA2 may include NMOS transistors constituting an equalizer unit EQ and a pre-charge unit PCH.

As shown in FIG. 2, by disposing the column selection transistors CSL Tr1, CSL Tr2, CSL Tr3, and CSL Tr4 to be adjacent to both sides of the corresponding sense amplifier blocks BLSA1 and BLSA2, an internal wire length of the bit line sense amplifier may be reduced and an internal arrangement of the bit line sense amplifier may be simplified. On the contrary, if the plurality of column selection transistors CSL Tr1, CSL Tr2, CSL Tr3, CSL Tr4, CSL Try, CSL Tr6, CSL Tr7, and CSL Tr8 are disposed on both end sides of a multi-stack structure including the plurality of sense amplifier blocks BLSA1, BLSA2, BLSA3, and BLSA4, the internal wire arrangement of the bit line sense amplifier may be complicated and lengthy.

Referring to FIG. 3, the bit line sense amplifier may include a plurality of sense amplifier regions SA1-SAn arranged in a direction orthogonal to the extending direction of the bit line BL or the complimentary bit line BLB. Each sense amplifier region SA1-SAn may include at least one NMOS driver NSA and one PMOS driver PSA.

The NMOS driver NSA may include a pair of NMOS transistors, and the PMOS driver PSA may include a pair of PMOS transistors. The first sense amplifier region SA1 may include a column selection unit CSL Tr1, a PMOS driver PSA, an NMOS driver NSA, an equalizer unit EQ, a pre-charge unit PCH and a complimentary column selection unit CSL Tr2. For example, referring to FIG. 1 to FIG. 3, the first sense amplifier region SA1 may mean a region including the first sense amplifier block BLSA1, and the column selection unit CSL Tr1 and the complimentary column selection unit CSL Tr2 on both sides thereof. A memory cell area MCA may be connected to the column selection unit CSL Tr1 of the first sense amplifier region SA1. The first sense amplifier region SA1 may be repeated to include a region including the second sense amplifier block BLSA2, and the column selection unit CSL Tr3 and the complimentary column selection unit CSL Tr4 on both sides thereof.

The column selection unit CSL Tr3 of the repeated first sense amplifier region may be connected to the complimentary column selection unit CSL Tr2 of the first sense amplifier region SA1.

The column selection unit CSL Tr1 connects or disconnects the local input/output line LIO connected to the bit line BL and the data input/output pin in response to the signal transmitted through the column selection line CSL1. The column selection unit CSL Tr1 may include an NMOS transistor.

The PMOS driver PSA senses and amplifies a signal difference between the bit line BL and the complimentary bit line BLB in response to the power source voltage transmitted through the power source voltage supply line LA. The PMOS driver PSA may include PMOS transistors PMOS.

The NMOS driver NSA detects and amplifies the signal difference between the bit line BL and the complimentary bit line BLB in response to the ground voltage transmitted through the ground voltage supply line LAB. The NMOS driver NSA may include NMOS transistors NMOS.

The equalizer unit EQ equalizes the voltage of the bit line BL and the voltage of the complimentary bit line BLB in response to a signal transmitted through a pre-charge/equalization signal line PEQ. The equalizer unit EQ may include an NMOS transistor.

The pre-charge unit PCH pre-charges the voltage of the bit line BL and the voltage of the complimentary bit line BLB to a pre-charge voltage (i.e., a power pre-charge with source voltage) in responds to the signal transmitted through the pre-charge/equalization signal line PEQ. The pre-charge unit PCH may include NMOS transistors. The pre-charge voltage is supplied through the pre-charge voltage line VBL.

The complimentary column selection unit CSL Tr2 connects or disconnects the complimentary local input/output line LIOB connected to the complimentary bit line BLB and the data input/output pin in response to a signal transmitted through the complimentary column selection line CSL2. The complimentary column selection unit CSL Tr2 may include an NMOS transistor.

The second to n-th sense amplifier blocks SA2-SAn may include the same constituent elements as the constituent elements of the first sense amplifier block SA1.

The embodiment in which the first to n-th sense amplifier blocks SA1-SAn are repeated by 4 times and disposed (multi-stack) in a direction (a horizontal direction in FIG. 3) that the bit line BL or the complimentary bit line BLB extends is illustrated in FIG. 1. The number (the number of the multi-stack) of the times that the first to n-th sense amplifier blocks SA1-SAn are repeated in the direction in which the bit line BL or the complimentary bit line BLB extends may be three or less, or five or more. For example, the first sense amplifier block BLSA1 may be repeated 4 times to include the first to fourth sense amplifier blocks BLSA1, BLSA2, BLSA3, and BLSA4 as shown in FIG. 1, or may be repeated three times or less, or five times or more.

The bit line sense amplifier of this structure may be applied to either an open bit line structure or a folded bit line structure. For example, the memory cell array and the bit line sense amplifier may be connected in an open bit line structure or in a folded bit line structure. In addition, it may be applied to a semiconductor memory device of a cell-on-peri (COP) structure in which a memory cell is formed to overlap in a vertical direction by disposing the memory cell on a layer different from that of a peripheral driving circuit such as a bit line sense amplifier.

Figure 4:
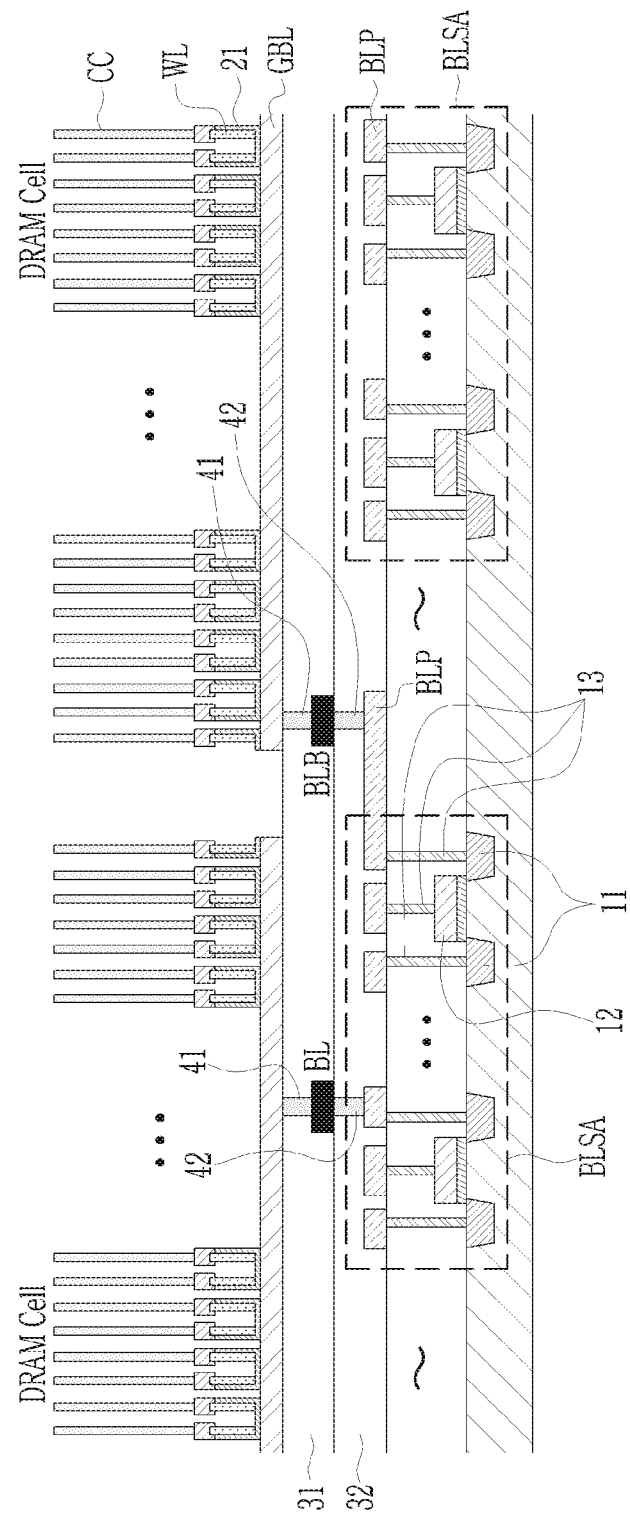
FIG. 4 is a layered cross-sectional view of a semiconductor memory device according to an embodiment of the present disclosure.

FIG. 4 is a layered cross-sectional view of a semiconductor memory device according to an embodiment of the present disclosure.

FIG. 4 is a cross-sectional view of a semiconductor memory device of a cell-on-peri structure, where the bit line sense amplifier may be disposed at the lower layer and the memory cell array may be disposed at the upper layer. Alternatively, the memory cell array may be disposed on either side of the bit line sense amplifier.

The memory cell array layer may include a plurality of array matrices each including a plurality of memory cells. Each of the plurality of array matrices may include a plurality of cell bit lines GBL and a plurality of word lines WL, and the memory cells may be disposed in regions where the plurality of cell bit lines GBL and the plurality of word lines WL intersect. Here, the plurality of memory cells may be volatile memory cells such as dynamic random access memory (DRAM), resistive memory cells such as phase-change RAM (PRAM) and resistive RAM (RRAM), nano floating gate memory (NFGM), Polymer RAM (PoRAM), Magnetic RAM (MRAM), Ferroelectric RAM (FeRAM) or flash memory cells (flash). Each memory cell may include a cell capacitor CC and a transistor connecting or disconnecting the cell capacitor CC with the cell bit lines GBL, and the transistor may include a channel 21 turned on/off according to the word lines WL signal. Here, the channel 21 may be formed in a vertical direction with respect to the array matrix, and may connect the cell bit lines GBL below the channel 21 and the cell capacitor CC above the channel 21. The channel 21 may include indium gallium zinc oxide (IGZO; indium-gallium-zinc-oxide). The bit line sense amplifier may perform read, write, and erase operations to the plurality of memory cells.

The sense amplifier layer may be disposed under the memory cell array layer, and may include a transistor, a wiring layer BLP, and a via 13 connecting between the transistor and the wiring layer BLP. The transistor may include a source/drain 11 and a gate electrode 12, and the source/drain 11 and the gate electrode 12 may be connected to the wiring layer BLP disposed on the sense amplifier layer through a via 13 disposed in an insulation layer. The transistor includes an NMOS transistor and a PMOS transistor constituting a sense amplifier, and may also include a column selection transistor of a column selection unit. The wiring layer BLP may include column selection lines CSL1 and CSL2, a power source voltage supply line LA, a ground voltage supply line LAB, a pre-charge/equalization signal line PEQ, a local input/output line LIO, a complimentary local input/output line LIOB, which are shown in FIGS. 3 and 4.

Interlayer insulating layers 31 and 32, and a bit line BL and a complimentary bit line BLB may be disposed between the sense amplifier layer and the memory cell array layer. The sense amplifier (or sense amplifier block) BLSA may be connected to the bit line BL and the complimentary bit line BLB each through a via 42 disposed in the interlayer insulating layer 32. The bit line BL and the complimentary bit line BLB may each be connected to the cell bit lines GBL through a via 41 (e.g., a BL contact, a BLB contact) disposed in the interlayer insulating layer 31. Here, the bit line BL and the complimentary bit line BLB connected to one sense amplifier BLSA (or sense amplifier block) may be respectively connected to cell bit lines GBL separated on both sides in the boundary region of two neighboring array matrices.

In this cell-on-peri structure semiconductor memory device, for the arrangement of the bit line sense amplifier, as illustrated in FIG. 1 to FIG. 3, by disposing the column selection unit (e.g., CSL Tr1 of FIG. 1) and the complimentary column selection unit (e.g., CSL Tr2 of FIG. 1) to be adjacent to both sides of the corresponding sense amplifier block (e.g., BLSA1 of FIG. 1), the internal wire length of the bit line sense amplifier may be reduced, the number of wires per unit area that need to be disposed inside the bit line sense amplifier may be reduced, thereby simplifying the arrangement of the bit line sense amplifier.

Figure 5:
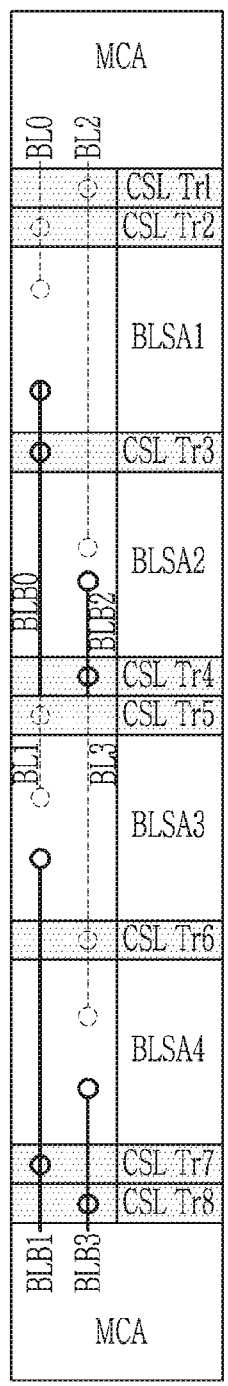
FIG. 5 is a layout view of a bit line sense amplifier of a semiconductor memory device according to an embodiment of the present disclosure.
Figure 6:
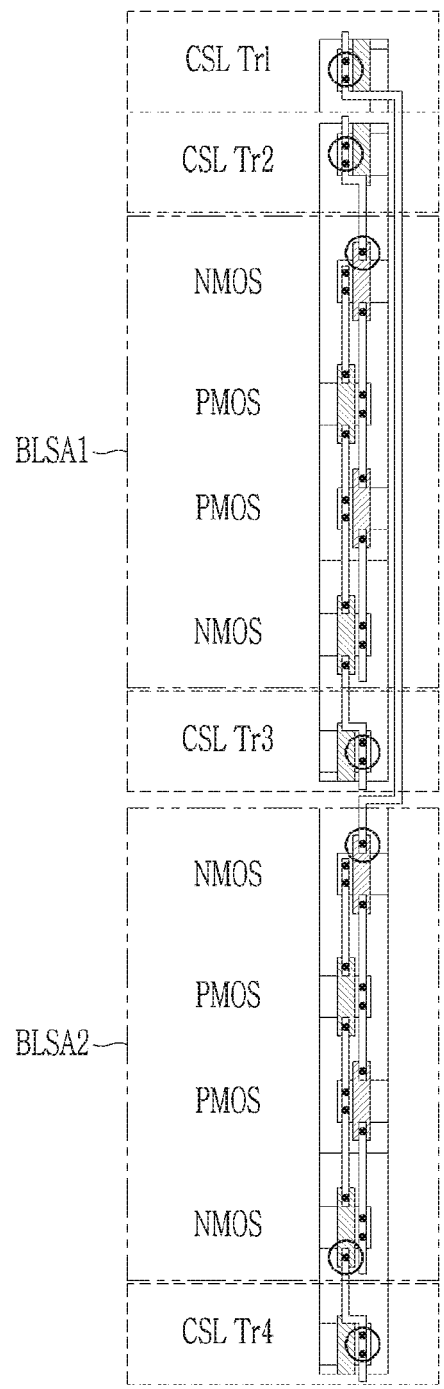
FIG. 6 is a more detailed layout view of a part of a bit line sense amplifier in FIG. 5.

FIG. 5 is a layout view of a bit line sense amplifier of a semiconductor memory device according to an embodiment of the present disclosure, and FIG. 6 is a more detailed layout view of a part of a bit line sense amplifier in FIG. 5.

Referring to FIG. 5 and FIG. 6, the bit line sense amplifier of the semiconductor memory device according to an embodiment of the present disclosure may include a plurality of sense amplifier blocks BLSA1, BLSA2, BLSA3, and BLSA4 and a plurality of column selection transistors CSL Tr1, CSL Tr2, CSL Tr3, CSL Tr4, CSL Tr5, CSL Tr6, CSL Tr7, and CSL Tr8, a plurality of bit lines BL0, BL1, BL2, and BL3, and a plurality of complimentary bit lines BLB0, BLB1, BLB2, and BLB3. A memory cell area MCA may be disposed on both sides of the bit line sense amplifier including these elements. The memory cell area MCA, as shown in FIG. 5, may be disposed on both sides of the bit line sense amplifier, but the present disclosure is not limited thereto. For example, the memory cell area MCA may be disposed on only one side of the bit line sense amplifier, or it may be disposed to overlap the bit line sense amplifier on a layer different from that of the bit line sense amplifier (a cell-on-peri structure).

FIG. 5 shows two bit line sense amplifier columns in which a plurality of sense amplifier blocks BLSA1, BLSA2, BLSA3, and BLSA4, and a plurality of column selection transistors CSL Tr1, CSL Tr2, CSL Tr3, CSL Tr4, CSL Tr5, CSL Tr6, CSL Tr7, and CSL Tr8 are arranged in one column, but the present disclosure is not limited thereto. For example, three or more bit line sense amplifier columns may be disposed.

The plurality of sense amplifier blocks BLSA1, BLSA2, BLSA3, and BLSA4 may be arranged in a direction that the plurality of bit lines BL0, BL1, BL2, and BL3 or the plurality of complimentary bit lines BLB0, BLB1, BLB2, and BLB3 extend, and the plurality of column selection transistors CSL Tr1, CSL Tr2, CSL Tr3, CSL Tr4, CSL Tr5, CSL Tr6, CSL Tr7, and CSL Tr8 may be disposed to be distributed between the plurality of sense amplifier blocks BLSA1, BLSA2, BLSA3, and BLSA4. With this configuration, internal wire arrangement may be simplified and shortened. If the plurality of column selection transistors CSL Tr1, CSL Tr2, CSL Tr3, CSL Tr4, CSL Tr5, CSL Tr6, CSL Tr7, and CSL Tr8 are not disposed to be distributed between the plurality of sense amplifier blocks BLSA1, BLSA2, BLSA3, and BLSA4, but are disposed on both end sides of a multi-stack structure including the plurality of sense amplifier blocks BLSA1, BLSA2, BLSA3, and BLSA4, the internal wire arrangement of the bit line sense amplifier may be complicated and lengthy. In the embodiment of FIG. 5, the first column selection transistor CSL Tr1 and the second column selection transistor CSL Tr2 may be disposed between the upper memory cell area MCA and the first sense amplifier block BLSA1, the third column selection transistor CSL Tr3 may be disposed between the first sense amplifier block BLSA1 and the second sense amplifier block BLSA2, the fourth and fifth column selection transistors CSL Tr4 and CSL Tr5 may be disposed between the second sense amplifier block BLSA2 and the third sense amplifier block BLSA3, the sixth column selection transistor CSL Tr6 may be disposed between the third sense amplifier block BLSA3 and the fourth sense amplifier block BLSA4, and the seventh and eighth column selection transistors CSL Tr7 and CSL Tr8 may be disposed between the fourth sense amplifier block BLSA4 and the lower memory cell area MCA. In a case of the cell-on-peri structure, the first and second column selection transistors CSL Tr1 and CSL Tr2 and the seventh and eighth column selection transistor CSL Tr7 and CSL Tr8 may be disposed on both ends of the bit line sense amplifier column, and the memory cell area MCA may overlap the bit line sense amplifier column on a layer different from that of the bit line sense amplifier column.

In the embodiment FIG. 5, four sense amplifier blocks BLSA1, BLSA2, BLSA3, and BLSA4 are described to be disposed to one bit line sense amplifier column, but the present disclosure is not limited thereto. For example, the number of the sense amplifier blocks disposed to one bit line sense amplifier column may be three or less, or five or more. The number of the column selection transistors included in one bit line sense amplifier column may be doubled according to the number of the sense amplifier blocks disposed to one bit line sense amplifier column.

Each of the plurality of bit lines BL0, BL1, BL2, and BL3 may be connected to one sense amplifier block and one column selection transistor, and each of the plurality of complementary bit lines BLB0, BLB1, BLB2, and BLB3 may be also connected to one sense amplifier block and one column selection transistor. For example, the bit line BL0 and the complementary bit line BLB0 connected to the first sense amplifier block BLSA1 may be connected to the second column selection transistor CSL Tr2 and the third column selection transistor CSL Tr3, respectively, and the bit line BL2 and the complementary bit line BLB2 connected to the second sense amplifier block BLSA2 may be connected to the first column selection transistor CSL Tr1 and the fourth column selection transistor CSL Tr4, respectively. The bit line BL1 and the complementary bit line BLB1 connected to the third sense amplifier block BLSA3 may be connected to the fifth column selection transistor CSL Tr5 and the seventh column selection transistor CSL Tr7, respectively, and the bit line BL3 and the complementary bit line BLB3 connected to the fourth sense amplifier block BLSA4 may be connected to the sixth column selection transistor CSL Tr6 and the eighth column selection transistor CSL Tr8, respectively. The column selection transistors CSL Tr3, CSL Tr4, CSL Tr7, and CSL Tr8 connected to the complementary bit lines BLB0, BLB1, BLB2, and BLB3 may be referred to as complementary column selection transistors to distinguish from the column selection transistors CSL Tr1, CSL Tr2, CSL Tr5, and CSL Tr6 connected to bit lines BL0, BL1, BL2, and BL3.

The plurality of column selection transistors CSL Tr1, CSL Tr2, CSL Tr3, CSL Tr4, CSL Tr5, CSL Tr6, CSL Tr7, and CSL Tr8 may be respectively connected to a plurality of column selection lines (see CSL1 and CSL2 of FIG. 3), and the plurality of column selection lines may be disposed at a position where at least a part thereof overlaps the corresponding column selection transistor. Therefore, the plurality of column selection lines may be also disposed in the border region between the plurality of sense amplifier blocks BLSA1, BLSA2, BLSA3, and BLSA4 like the plurality of column selection transistors CSL Tr1, CSL Tr2, CSL Tr3, CSL Tr4, CSL Tr5, CSL Tr6, CSL Tr7, and CSL Tr8. The plurality of column selection transistors CSL Tr1, CSL Tr2, CSL Tr3, CSL Tr4, CSL Tr5, CSL Tr6, CSL Tr7, and CSL Tr8 are elements of connecting or disconnecting a local input/output line LIO connected to the bit line BL and the data input/output pin in response to a signal transmitted through the plurality of column selection lines, or connecting or disconnecting a complementary local input/output line LIOB connected to the complementary bit line BLB and the data input/output pin, thereby functioning as a column selection unit or a complementary column selection unit, respectively. For example, the second column selection transistor CSL Tr2 may be an element of connecting or disconnecting a local input/output line LIO connected to the bit line BL0 and the data input/output pin, while the third column selection transistor CSL Tr3 may be an element of connecting or disconnecting a complementary local input/output line LIOB connected to the complementary bit line BLB0 and the data input/output pin in response to signals transmitted through a plurality of column selection lines.

Hereinafter, the column selection transistor may be referred to as a column selection unit, and the complementary column selection transistor may be referred to as a complementary column selection unit. However, the column selection unit and the complementary column selection unit may include an additional constituent element other than the transistor. A column selection line that transmits a column selection signal to the complementary column selection unit may be distinguished and referred to as a complementary column selection line. In other words, a plurality of column selection units may connect (or disconnect) the bit line BL and the local input/output line LIO according to a first column selection signal, and a plurality of complementary column selection units may connect (or disconnect) the complementary bit line BLB and the complementary local input/output line LIBO according to a second column selection signal. Also, the plurality of column selection lines (see CSL1 of FIG. 3) that transmit the first column selection signal to each of a plurality of column selection units may extend in a direction intersecting the direction in which the bit line BL extends, and the plurality of complementary column selection lines (see CSL2 of FIG. 3) that transmit the second column selection signal to each of a plurality of complementary column selection units may extend in a direction intersecting the direction in which the complementary bit line BLB extends.

In FIG. 5, first to fourth column selection units may be defined to respectively include the column selection transistors CSL Tr1, CSL Tr2, CSL Try, and CSL Tr6, and first to fourth complementary column selection units may be defined to respectively include the column selection transistors CSL Tr3, CSL Tr4, CSL Tr7, and CSL Tr8. The first complementary column selection unit (including CSL Tr3) may be disposed between the first sense amplifier block BLSA1 and the second sense amplifier block BLSA2, the second complementary column selection unit (including CSL Tr4) and the third column selection unit (including CSL Tr5) may be disposed between the second sense amplifier block BLSA2 and the third sense amplifier block BLSA3, and the fourth column selection unit (including CSL Tr6) may be disposed between the third sense amplifier block BLSA3 and the fourth sense amplifier block BLSA4. The first and second column selection units (including CSL Tr1 and CSL Tr2) may be disposed on a side of the first sense amplifier block BLSA1 opposite to the first complementary column selection unit (including CSL Tr3), and the third and fourth complementary column selection units (including CSL Tr7 and CSL Tr8) may be disposed on a side of the fourth sense amplifier block BLSA4 opposite to the fourth column selection unit (including CSL Tr6). The second column selection unit (including CSL Tr2) may be disposed between the first column selection unit (including CSL Tr1) and the first sense amplifier block BLSA1, and the third complimentary column selection unit (including CSL Tr7) may be disposed between the fourth complimentary column selection unit (including CSL Tr8) and the fourth sense amplifier block BLSA4.

FIG. 6 shows a region corresponding to the first and second sense amplifier blocks BLSA1 and BLSA2, and the first to fourth column selection transistors CSL Tr1, CSL Tr2, CSL Tr3, and CSL Tr4 of FIG. 5.

Each of the first and second sense amplifier blocks BLSA1 and BLSA2 may include a pair of NMOS transistor NMOS and a pair of PMOS transistor PMOS. A pair of NMOS transistors NMOS may compose one NMOS driver NSA, and a pair of PMOS transistor PMOS may compose one PMOS driver PSA. In addition, each of the first and second sense amplifier blocks BLSA1 and BLSA2 may include an equalizer unit EQ and NMOS transistors constituting the pre-charge unit PCH.

as shown in FIG. 6, by disposing the column selection transistors CSL Tr1, CSL Tr2, CSL Tr3, and CSL Tr4 to be distributed between and on both sides of the corresponding sense amplifier blocks BLSA1 and BLSA2, the internal wire length of the bit line sense amplifier may be reduced, and the number of wires per unit area that need to be disposed inside the bit line sense amplifier may be reduced, thereby simplifying the arrangement of the bit line sense amplifier.

In concluding the detailed description, those skilled in the art will appreciate that many variations and modifications can be made to the preferred embodiments without departing from the spirit and scope of the present disclosure as defined by the appended claims. Therefore, the disclosed preferred embodiments of the present disclosure are used in a generic and descriptive sense only and not for purposes of limitation.

The invention claimed is:

1. A bit line sense amplifier of a semiconductor memory device comprising:
  a plurality of sense amplifier blocks including a PMOS driver and/or an NMOS driver that detects and amplifies a signal difference between a bit line and a complimentary bit line, and sequentially arranged in a first direction in which the bit line and the complimentary bit line extend;
  a plurality of column selection units that connect the bit line and a local input/output line according to a first column selection signal;
  a plurality of complimentary column selection units that connect the complimentary bit line and a complimentary local input/output line according to a second column selection signal;
  a plurality of column selection lines that transmit the first column selection signal to each of the plurality of column selection units and extend in a second direction intersecting the first direction; and
  a plurality of complimentary column selection lines that transmit the second column selection signal to each of the plurality of complimentary column selection units and extend in the second direction,
  wherein the plurality of column selection units and the plurality of complimentary column selection units are disposed to be distributed between the plurality of sense amplifier blocks sequentially arranged in the first direction.

2. The bit line sense amplifier of the semiconductor memory device of claim 1, wherein
  each of the plurality of sense amplifier blocks is disposed between one of the plurality of column selection units and one of the plurality of complimentary column selection units.

3. The bit line sense amplifier of the semiconductor memory device of claim 2, wherein
  the bit line and the complimentary bit line that are connected to one of the plurality of sense amplifier blocks are respectively connected to one of the plurality of column selection units and one of the plurality of complimentary column selection units disposed on both sides of the one of the plurality of sense amplifier blocks connected thereto.

4. The bit line sense amplifier of the semiconductor memory device of claim 2, wherein
  at least a part of the plurality of column selection lines overlaps the plurality of column selection units, and
  at least a part of the plurality of complimentary column selection lines overlaps the plurality of complimentary column selection units.

5. The bit line sense amplifier of the semiconductor memory device of claim 1, wherein
  the plurality of sense amplifier blocks include first to fourth sense amplifier blocks sequentially arranged, the plurality of column selection units include first to fourth column selection units, and the plurality of complimentary column selection units include first to fourth complimentary column selection units.

6. The bit line sense amplifier of the semiconductor memory device of claim 5, wherein
  the first complimentary column selection unit and the second column selection unit are disposed between the first sense amplifier block and the second sense amplifier block, the second complimentary column selection unit and the third column selection unit are disposed between the second sense amplifier block and the third sense amplifier block, and the third complimentary column selection unit and the fourth column selection unit are disposed between the third sense amplifier block and the fourth sense amplifier block.

7. The bit line sense amplifier of the semiconductor memory device of claim 6, wherein
  the first column selection unit is disposed on a side of the first sense amplifier block opposite to the first complimentary column selection unit, and the fourth complimentary column selection unit is disposed on a side of the fourth sense amplifier block opposite to the fourth column selection unit.

8. The bit line sense amplifier of the semiconductor memory device of claim 5, wherein
  the first complimentary column selection unit is disposed between the first sense amplifier block and the second sense amplifier block, the second complimentary column selection unit and the third column selection unit are disposed between the second sense amplifier block and the third sense amplifier block, and the fourth column selection unit is disposed between the third sense amplifier block and the fourth sense amplifier block.

9. The bit line sense amplifier of the semiconductor memory device of claim 8, wherein
  the first and second column selection units are disposed on a side of the first sense amplifier block opposite to the first complimentary column selection unit, and the third and fourth complimentary column selection units are disposed on a side of the fourth sense amplifier block opposite to the fourth column selection unit.

10. The bit line sense amplifier of the semiconductor memory device of claim 9, wherein
the second column selection unit is disposed between the first column selection unit and the first sense amplifier block, and the third complimentary column selection unit is disposed between the fourth complimentary column selection unit and the fourth sense amplifier block.

11. The bit line sense amplifier of the semiconductor memory device of claim 1, wherein
the plurality of column selection units and the plurality of complimentary column selection units are NMOS transistors.

12. A semiconductor memory device comprising:
a memory cell array in which a plurality of memory cells are arranged; and
a bit line sense amplifier that performs read, write, and erase operations to the plurality of memory cells,
wherein the bit line sense amplifier includes:
a plurality of sense amplifier blocks including a PMOS driver and/or an NMOS driver that detects and amplifies a signal difference between a bit line and a complimentary bit line, and sequentially arranged in a first direction in which the bit line and the complimentary bit line extend;
a plurality of column selection units that connect the bit line and a local input/output line according to a first column selection signal;
a plurality of complimentary column selection units that connect the complimentary bit line and a complimentary local input/output line according to a second column selection signal;
a plurality of column selection lines that transmit the first column selection signal to each of the plurality of column selection units and extend in a second direction intersecting the first direction; and
a plurality of complimentary column selection lines that transmit the second column selection signal to each of the plurality of complimentary column selection units and extend in the second direction, and
the plurality of column selection units and the plurality of complimentary column selection units are disposed to be distributed between the plurality of sense amplifier blocks sequentially arranged in the first direction.

13. The semiconductor memory device of claim 12, wherein
the memory cell array is disposed to overlap the bit line sense amplifier by disposing the memory cell array on a layer different from that of the bit line sense amplifier.

14. The semiconductor memory device of claim 12, wherein
the memory cell array is disposed on either side of the bit line sense amplifier.

15. The semiconductor memory device of claim 12, wherein
the memory cell array and the bit line sense amplifier are connected in an open bit line structure.

16. The semiconductor memory device of claim 12, wherein
the memory cell array and the bit line sense amplifier are connected in a folded bit line structure.

17. The semiconductor memory device of claim 12, wherein
the plurality of sense amplifier blocks include first to fourth sense amplifier blocks sequentially arranged, the plurality of column selection units include first to fourth column selection units, and the plurality of complimentary column selection units include first to fourth complimentary column selection units, and
the first complimentary column selection unit and the second column selection unit are disposed between the first sense amplifier block and the second sense amplifier block, the second complimentary column selection unit and the third column selection unit are disposed between the second sense amplifier block and the third sense amplifier block, and the third complimentary column selection unit and the fourth column selection unit are disposed between the third sense amplifier block and the fourth sense amplifier block.

18. The semiconductor memory device of claim 17, wherein
the first column selection unit is disposed on a side of the first sense amplifier block opposite to the first complimentary column selection unit, and the fourth complimentary column selection unit is disposed on a side of the fourth sense amplifier block opposite to the fourth column selection unit.

19. The semiconductor memory device of claim 12, wherein
the plurality of sense amplifier blocks include first to fourth sense amplifier blocks sequentially arranged, the plurality of column selection units include first to fourth column selection units, and the plurality of complimentary column selection units include first to fourth complimentary column selection units, and
the first complimentary column selection unit is disposed between the first sense amplifier block and the second sense amplifier block, the second complimentary column selection unit and the third column selection unit are disposed between the second sense amplifier block and the third sense amplifier block, and the fourth column selection unit is disposed between the third sense amplifier block and the fourth sense amplifier block.

20. The semiconductor memory device of claim 19, wherein
the first and second column selection units are disposed on a side of the first sense amplifier block opposite to the first complimentary column selection unit, and the third and fourth complimentary column selection units are disposed on a side of the fourth sense amplifier block opposite to the fourth column selection unit.

* * * * *